(12) United States Patent
Kobayakawa

(10) Patent No.: US 7,456,494 B2
(45) Date of Patent: Nov. 25, 2008

(54) SURFACE MOUNT ELECTRONIC COMPONENT AND PROCESS FOR MANUFACTURING SAME

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 213 days.

(21) Appl. No.: 11/630,823

(22) PCT Filed: May 12, 2005

(86) PCT No.: PCT/JP2005/008714

§ 371 (c)(1),
(2), (4) Date: Dec. 22, 2006

(87) PCT Pub. No.: WO2006/001130

PCT Pub. Date: Jan. 5, 2006

(65) Prior Publication Data

US 2008/0191328 A1 Aug. 14, 2008

(30) Foreign Application Priority Data

Jun. 23, 2004 (JP) .............................. 2004-185467

(51) Int. Cl.
*H01L 23/495* (2006.01)
(52) U.S. Cl. ........................ 257/676; 257/692; 257/693; 257/782; 257/E23.031; 257/E23.037; 438/108; 438/123
(58) Field of Classification Search ................. 257/676, 257/692, 693, E23.031, E23.037; 438/108, 438/123
See application file for complete search history.

(56) References Cited

U.S. PATENT DOCUMENTS 5,977,613 A 11/1999 Takata et al.

(Continued)

FOREIGN PATENT DOCUMENTS

JP 1-106456 4/1989

(Continued)

OTHER PUBLICATIONS

International Search Report from the corresponding application PCT/JP2005/008714, mailed on Jun. 7, 2005.

*Primary Examiner*—Victor A Mandala
(74) *Attorney, Agent, or Firm*—Hamre, Schumann, Mueller & Larson, P.C.

(57) ABSTRACT

A surface mount electronic component includes a set of a first lead terminal 2a and a second lead terminal 3b, a semiconductor element 6a die-bonded to an island portion 4a integrally formed at an end of the first lead terminal, a metal wire 7a electrically connecting the semiconductor element and a bonding portion 5b integrally formed at an end of the second lead terminal to each other, and a package 8 made of synthetic resin and hermetically sealing the island portion and the bonding portion. The island portion and the bonding portion are formed by plastic deformation of a portion of each of the lead terminals to be positioned within the package from a lower surface side to reduce the thickness and increase the width. A portion of a lower surface of each of the first lead terminal and the second lead terminal which is not subjected to the plastic deformation is exposed at a lower surface of the package to serve as a mount surface for soldering, so that a soldering area large enough to perform soldering is provided at each of the lead terminals.

5 Claims, 8 Drawing Sheets

U.S. PATENT DOCUMENTS

| | | | |
|---|---|---|---|
| 6,538,306 B1 * | 3/2003 | Inada et al. | 257/666 |
| 6,821,820 B2 | 11/2004 | Inatsugu | |
| 7,134,311 B2 * | 11/2006 | Iwabuchi | 72/414 |
| 2003/0038162 A1 * | 2/2003 | Chew et al. | 228/180.21 |

FOREIGN PATENT DOCUMENTS

| | | |
|---|---|---|
| JP | 3-248551 | 11/1991 |
| JP | 9-298256 | 11/1997 |
| JP | 2003-258183 | 9/2003 |

* cited by examiner

SURFACE MOUNT ELECTRONIC COMPONENT AND PROCESS FOR MANUFACTURING SAME

TECHNICAL FIELD

The present invention relates to an electronic component, such as a diode or a transistor, which includes a semiconductor element hermetically sealed in a package made of synthetic resin. Of such electronic components, the present invention particularly relates to a surface mount electronic component in which lead terminals for the semiconductor element are exposed at the lower surface of the package to be suitable for surface mounting.

BACKGROUND ART

FIGS. 14-16 show a surface mount electronic component disclosed in Patent Document 1 as a prior art.

The surface mount electronic component 1' includes at least a set of lead terminals 2' and 3' made of a thin metal plate and arranged on the same plane to extend in opposite directions from each other. The first lead terminal 2' has an end integrally formed with an island portion 4' having a relatively large width, whereas the second lead terminal 3' has an end integrally formed with a bonding portion 5' having a relatively large width. A semiconductor chip 6' is bonded on the island portion 4'. The semiconductor chip 6' is electrically connected to the bonding portion 5' of the second lead terminal 3' by e.g. wire bonding using a wire 7'. The above-described parts are hermetically sealed in a package 8' made of a synthetic resin so that the lead terminals 2' and 3' partially project from opposite side surfaces 8a and 8b of the package 8', respectively. Each of the lead terminals 2' and 3' includes a bent portion 2a' and 3a' positioned within the package 8' and formed by bending the lead terminal downward and then in the direction along the lower surface 8c' of the package 8'. With this structure, part of the lower surfaces of the lead terminals 2' and 3' serves as mount surfaces 9', 10' exposed at the lower surface 8c' of the package 8'.

Patent Document 1: JP-A-H03-248551

DISCLOSURE OF THE INVENTION

Problems to be Solved by the Invention

In the surface mount electronic component 1' having the above-described structure, the mount surfaces 9' and 10' of the lower surfaces of the lead terminals 2' and 3' need to have an appropriate area for obtaining appropriate soldering strength. Further, the upper surfaces of the island portion 4' and the bonding portion 5' of the lead terminals 2' and 3' need to have an area large enough to bond the semiconductor chip 6' and the metal wire 7'.

However, in the above-described conventional surface mount electronic component 1', bent portions 2a' and 3a' are provided in the lead terminals 2' and 3' at portions located within the package 8', and the lower surfaces of the lead terminals 2' and 3' are exposed at the lower surface 8c' of the package 8' to serve as mount surfaces 9' and 10' for soldering. In this structure, the mount surfaces 9', 10', and the island portions 4' for the die-bonding of the semiconductor chip 6' and the bonding portion 5' for the wire bonding of the metal wire 7' are divided by the bent portions 2a' and 3a' as the boundary.

Therefore, when the area of the upper surfaces of the island portions 4' and the bonding portion 5' for bonding is set large, the bent portions 2a' and 3a' are positioned close to the opposite side surfaces 8a' and 8b' of the package 8'. In such a case, the penetrating length A' of the mount surfaces 9', 10' from the opposite side surfaces 8a', 8b' reduces, so that the area of the mount surfaces 9', 10' reduces.

Conversely, when the penetrating length A' of the mount surfaces 9', 10' from the opposite side surfaces 8a', 8b' of the package 8' is increased to increase the area of the mount surfaces 9', 10', the bent portions 2a' and 3a' are positioned close to each other. In such a case, the area of the upper surface of the island portion 4' and the bonding portion 5' positioned between the bent portions is disadvantageously reduced.

In this way, when either one of the area of the mount surfaces 9', 10, i.e., the penetrating length A' of the mount surfaces 9', 10' from the opposite side surfaces 8a', 8b' of the package 8' and the area of the island portion 4' for bonding the semiconductor chip 6' and the bonding portion 5' for bonding the metal wire 7' is increased, the other one reduces. Therefore, without increasing either one or both of the width W of the package 8' and the projecting length L' of the lead terminals 2', 3' from the side surfaces 8a', 8b' of the package 8', it is impossible to provide both of the island portion 4' and the bonding portion 5' which are large enough to bond the semiconductor chip 6' and the mount surfaces 9' and 10' which are large to perform soldering.

Moreover, in each of the lead terminals 2' and 3', the corner from the lower surface of the lead terminal to the bent portion 2a', 3a' is inevitably round. Therefore, in forming the package 8' by transfer molding, a tapered space is defined between the corner and the mold, and synthetic resin is loaded in this space. As a result, a thin burr of synthetic resin is formed, and the burr partially chips and drops. Therefore, as indicated by double-dashed lines in FIG. 16, the boundary 9a', 10a' of the mount surface 9', 10' with respect to the lower surface 8c' of the package 8' becomes irregular, and the penetrating length A also becomes irregular.

A technical object of the present invention is to provide a surface mount electronic component and a manufacturing method capable of solving these problems.

Means for Solving the Problems

To achieve the technical object, as set forth in claim 1, a surface mount electronic component according to the present invention comprises a set of a first lead terminal and a second lead terminal, a semiconductor element die-bonded to an upper surface of an island portion integrally formed at an end of the first lead terminal, a metal wire electrically connecting the semiconductor element and an upper surface of a bonding portion integrally formed at an end of the second lead terminal to each other, and a package made of synthetic resin and hermetically sealing the island portion and the bonding portion.

In this electronic component, the island portion of the first lead terminal and the bonding portion of the second lead terminal are formed by plastic deformation of a portion of each of the lead terminals to be positioned within the package, the plastic deformation being performed from a lower surface side to reduce thickness and increase width while keeping upper surfaces of the island portion and the bonding portion flush or generally flush with upper surfaces of the lead terminals. A portion of a lower surface of each of the first lead terminal and the second lead terminal which is not subjected to the plastic deformation is exposed at a lower surface of the package to serve as a mount surface for soldering.

Firstly, as set forth in claim 2, a manufacturing method according to the present invention comprises the steps of:

subjecting part of a lead from to plastic deformation so as to dent the part from a lower surface side thereof;

punching the lead frame to provide a set of a first lead terminal and a second lead terminal which extend across a line connecting two holes so that the first lead terminal includes a thin and wide island portion formed by the plastic deformation and the second lead terminal includes a thin and wide bonding portion formed by the plastic deformation;

die-bonding a semiconductor element on an upper surface of the island portion of the first lead terminal and connecting the semiconductor element and an upper surface of the bonding portion of the second lead terminal to each other by wire bonding using a metal wire;

hermetically sealing the island portion of the first lead terminal and the bonding portion of the second lead terminal in a package of synthetic resin so that a portion of a lower surface of each of the first lead terminal and the second lead terminal which is not subjected to the plastic deformation is exposed at a lower surface of the package to serve as a mount surface for soldering; and cutting a portion of each of the lead terminals which projects from the package.

Secondly, as set forth in claim 3, a manufacturing method according to the present invention comprises the steps of:

forming two holes in a lead frame while keeping an appropriate space between the holes;

performing plastic deformation of a portion of the lead frame between the holes to dent the portion from a lower surface side, punching the lead frame to provide sets of first lead terminals and second lead terminals each of which extends across a line connecting the two holes so that each of the first lead terminals includes a thin and wide island portion formed by the plastic deformation and each of the second lead terminals includes a thin and wide bonding portion formed by the plastic deformation;

die-bonding a semiconductor element on an upper surface of the island portion of each of the first lead terminals and connecting the semiconductor element and an upper surface of the bonding portion of the second lead terminal in a same set to each other by wire bonding using a metal wire;

hermetically sealing the island portion of each of the first lead terminals and the bonding portion of each of the second lead terminals in a package of synthetic resin so that a portion of a lower surface of each of the lead terminals which is not subjected to the plastic deformation is exposed at a lower surface of the package to serve as a mount surface for soldering; and cutting a portion of each of the lead terminals which projects from the package.

Further, as set forth in claim 4, the manufacturing method as set forth in claim 3 may further comprise the step of forming an auxiliary hole between the lead terminals of the lead frame before the step of performing plastic deformation of the lead frame to dent the lead frame from the lower surface side.

Further, as set forth in claim 5, in the manufacturing method as set forth in claim 3, the inner dimension of the two holes of the lead frame along the longitudinal direction of the lead terminals may not be larger than the width of the plastic deformation to dent the lead frame.

ADVANTAGES OF THE INVENTION

As set forth in claim 1, the island portion of the first lead terminal and the bonding portion of the second lead terminal are formed by plastic deformation of a portion of each of the lead terminals to be positioned within the package from a lower surface side to reduce the thickness and increase the width while keeping the upper surfaces of the island portion and the bonding portion flush or generally flush with the upper surfaces of the lead terminals. Further, a portion of a lower surface of each of the first lead terminal and the second lead terminal which is not subjected to the plastic deformation is exposed at a lower surface of the package to serve as a mount surface for soldering. With this structure, the mount surface for soldering which is to be exposed at the lower surface of the package can be formed by utilizing the lower surface of each lead terminal, whereas the island portion and the bonding portion can be formed by utilizing the upper surface of each lead terminal. Therefore, the penetrating length of the mount surface from the side surface of the package can be increased independently from the area of the island portion and the bonding portion of the lead terminals for bonding a semiconductor element and a metal wire, i.e., without reducing the area of the island portion and the bonding portion.

Therefore, according to the present invention, without increasing either one or both of the width of the package and the projecting length of the lead terminals from the side surfaces of the package, it is possible to provide an island portion and a bonding portion which are large enough to bond a semiconductor element and a metal wire, while at the same time providing the lower surfaces of the lead terminals with mount surfaces which are large enough to perform soldering.

Further, since the island portion and the bonding portion are formed by plastic deformation of the ends of the lead terminals, the corner where the mount surface of the lower surface meet the side surface rising from the mount surface toward the island portion or the bonding portion can be reliably made angular, not round. Therefore, it is possible to prevent or suppress the formation of a burr of synthetic resin at this portion. As a result, the boundary of the mount surface with respect to the lower surface of the package can be made uniform, so that the penetrating length of the mount surface from the side surface of the package can be made generally constant.

According to the manufacturing method as set forth in claim 2, an electronic component having the above-described advantageous structure can be manufactured at a relatively low cost by performing plastic deformation and punching of a lead frame.

According to the manufacturing method as set forth in claim 3, an electronic component having the above-described advantageous structure and including a plurality of sets of lead terminals can be manufactured similarly at a relatively low cost by performing plastic deformation and punching of a lead frame.

Further, in the manufacturing method as set forth in claim 3, the plastic deformation of a lead frame is performed with respect to a portion between two holes formed in the lead frame, so that excess thickness generated in the plastic deformation can be caused to escape into the holes on the opposite sides. Therefore, the load necessary for performing the plastic deformation can be reduced, and the lead frame is prevented from warping due to the plastic deformation.

Particularly, by applying claim 4 or 5 to the manufacturing method as set forth in claim 3, the mount surface of each lead terminal is advantageously prevented from being irregularly shaped in the plastic deformation of the lead frame, which will be described in detail in the foregoing embodiments.

Figure 1:
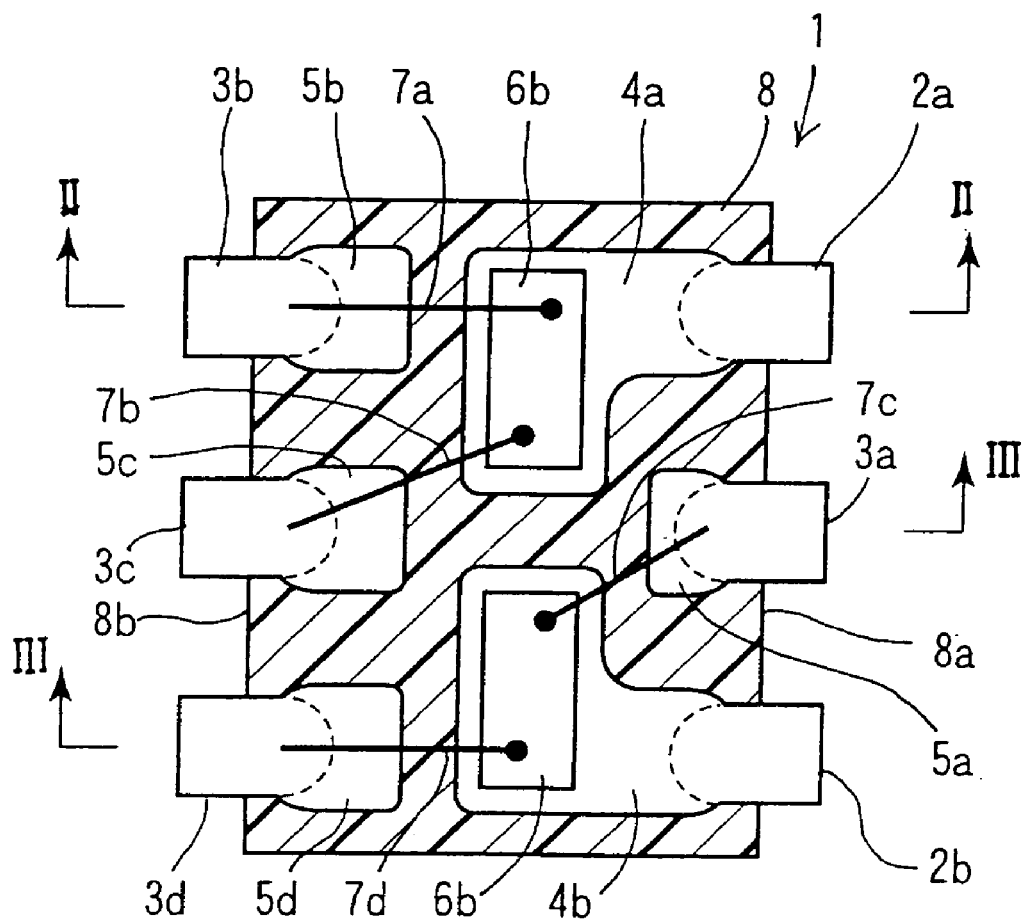
FIG. 1 is a plan view showing an electronic component according to an embodiment of the present invention.
Figure 2:
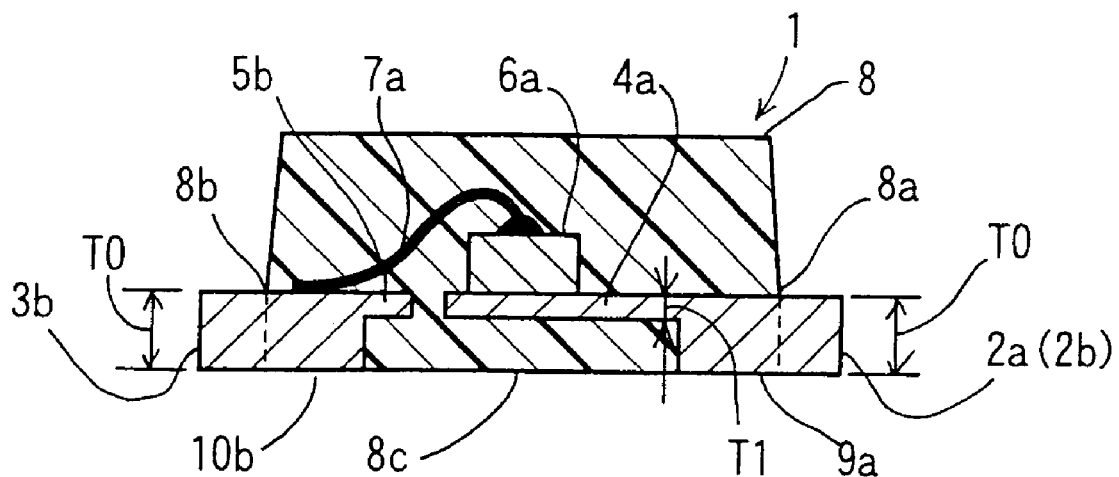
FIG. 2 is a sectional view taken along lines II-II in FIG. 1.
Figure 3:
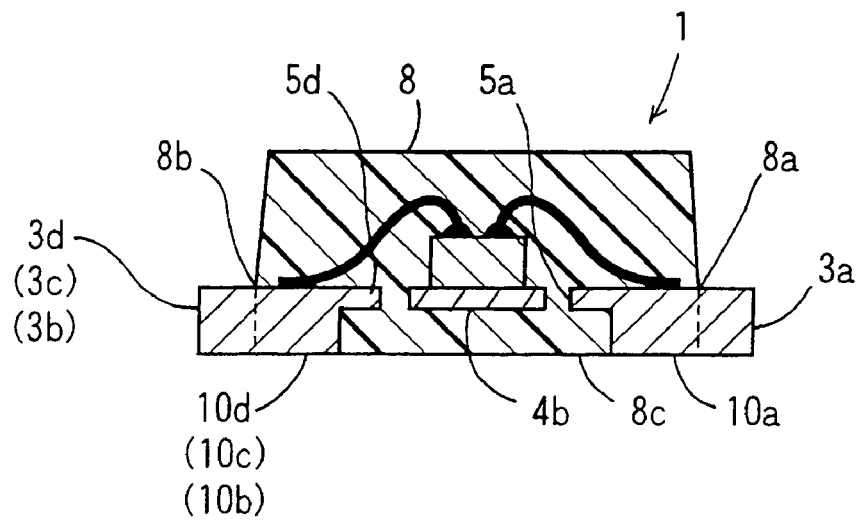
FIG. 3 is a sectional view taken along lines III-III in FIG. 1.
Figure 4:
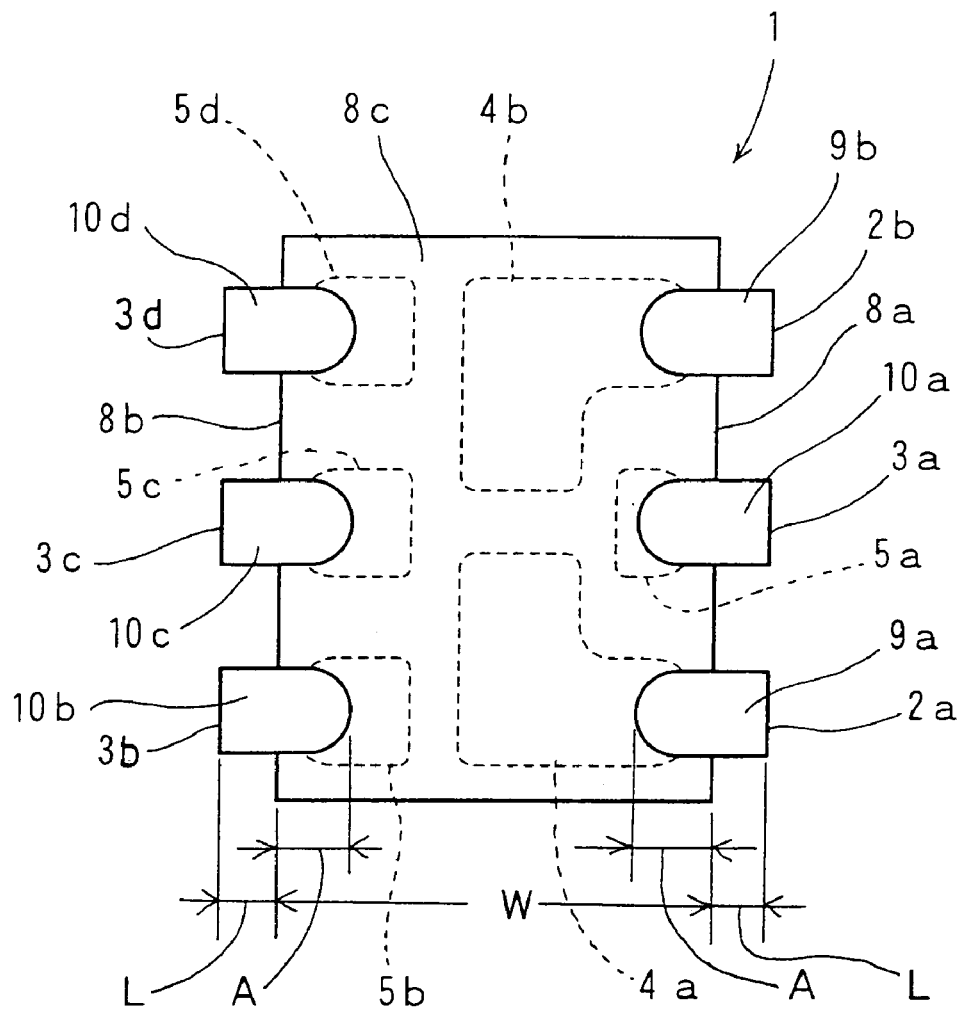
FIG. 4 is a bottom view of FIG. 1.

DESCRIPTION OF SIGNS 1 electronic component
2a, 2b first lead terminal
3a, 3b, 3c, 3d second lead terminal
4a, 4b island portion
5a, 5b, 5c, 5d bonding portion
6a, 6b semiconductor element
7a, 7b, 7c, 7d metal wire
8 package
8a, 8b side surface of a package
8c lower surface of a package
9a, 9b mount surface
10a, 10b, 10c, 10d mount surface
13 lead frame
14, 15 hole
16 auxiliary hole

BEST MODE FOR CARRYING OUT THE INVENTION

Preferred embodiments of the present invention will be described below with reference to FIGS. 1-13.

Of these figures, FIGS. 1-4 show an electronic component 1 including plural sets of, i.e., two sets of first and second lead terminals, each set consisting of one first lead terminal and two second lead terminals.

In the electronic component 1, two first lead terminals 2a, 2b and one second lead terminal 3a, which are made of a lead frame having a relatively large thickness T0, are arranged on one side so that the lead terminal 3a is positioned between the first lead terminals 2a and 2b. On the opposite side, three second lead terminals 3b, 3c and 3d similarly made of a metal material having a relatively large thickness T0 are arranged side by side. The first lead terminals 2a and 2b have respective ends integrally formed with island portions 4a and 4b having a relatively large width. The island portions are formed by subjecting the ends to plastic deformation from the lower surface side so as to reduce the thickness to T1. On the other hand, the second lead terminals 3a, 3b, 3c and 3d have respective ends integrally formed with bonding portions 5a, 5b, 5c and 5d having a relatively large width. The bonding portions are formed by subjecting the ends to plastic deformation from the lower surface side so as to reduce the thickness.

The upper surfaces of the first lead terminals 2a, 2b and the upper surfaces of the second lead terminals 3a, 3b, 3c, 3d are flush or generally flush with each other. The upper surfaces of the island portions 4a, 4b and the upper surfaces of the corresponding first lead terminals 2a, 2b are flush or generally flush with each other. The upper surfaces of the bonding portions 5a, 5b, 5c, 5d and the upper surfaces of the corresponding second lead terminals 3a, 3b, 3c, 3d are flush or generally flush with each other.

Semiconductor elements 6a and 6b such as semiconductor chips are bonded to the upper surfaces of the island portions 4a and 4b of the two first lead terminals 2a and 2b, respectively. Of the two semiconductor elements 6a and 6b, one semiconductor chip, i.e., the semiconductor chip 6a is electrically connected to the bonding portions 5b and 5c of the two second lead terminals 3b and 3c by wire bonding using metal wires 7a and 7b. The other semiconductor chip 6b is electrically connected to the bonding portions 5a and 5d of the two second lead terminals 3a and 3d by wire bonding using metal wires 7c and 7d.

The first lead terminals 2a, 2b and the second lead terminals 3a, 3b, 3c, 3d are hermetically sealed in a package 8 made of a thermosetting synthetic resin such as epoxy resin so that the lead terminals partially project from opposite side surfaces 8a and 8b of the package 8.

In sealing the lead terminals in the package 8, of the lower surfaces of the first lead terminals 2a and 2b, the portions which are not deformed by the above-described plastic deformation are exposed at the lower surface 8c of the resin package 8 to serve as mount surfaces 9a and 9b for soldering. Similarly, of the lower surfaces of the second lead terminals 3a, 3b, 3c and 3d, the portions which are not deformed by the plastic deformation are exposed at the lower surface 8c of the resin package 8 to serve as mount surfaces 10a, 10b, 10c and 10d for soldering.

Each of the mount surfaces 9a, 9b of the first lead terminals 2a, 2b and the mount surfaces 10a, 10b, 10c, 10d of the second lead terminals 3a, 3b, 3c, 3d is formed with a metal plating layer such as tin suitable for soldering.

In this electronic component 1, the island portions 4a, 4b of the first lead terminals 2a, 2b and the bonding portions 5a, 5b, 5c, 5d of the second lead terminals 3a, 3b, 3c, 3d are formed by subjecting part of the lead terminals within the package 8 to plastic deformation from the lower surface side to reduce the thickness and increase the width of the part while keeping the upper surfaces of the island portions and bonding portions flush or generally flush with the upper surfaces of the lead terminals. Further, the mount surfaces 9a, 9b of the first lead terminals 2a, 2b and the mount surfaces 10a, 10b, 10c, 10d of the second lead terminals 3a, 3b, 3c, 3d are provided by exposing part of the lower surfaces of the lead terminals which is not deformed by the plastic deformation at the lower surface 8c of the package 8.

In this way, the mount surfaces 9a, 9b, 10a, 10b, 10c, 10d for soldering to be exposed at the lower surface 8c of the package 8 can be provided by utilizing the lower surfaces of the lead terminals 2a, 2b, 3a, 3b, 3c, 3d, whereas the island portions 4a, 4b and the bonding portions 5a, 5b, 5c, 5d can be provided by utilizing the upper surfaces of the lead terminals. Therefore, the penetrating length A of each of the mount surfaces from the side surface 8a, 8b of the resin package 8 can be increased without reducing the area of the island portions 4a, 4b and bonding portions 5a, 5b, 5c, 5d of the lead terminals for die-bonding of the semiconductor elements 6a, 6b and wire-bonding of the metal wires 7a, 7b, 7c, 7d. Therefore, it is possible to provide the island portions 4a, 4b and bonding portions 5a, 5b, 5c, 5d which are large enough to bond the semiconductor elements 6a, 6b and the metal wires 7a, 7b, 7c, 7d, while at the same time providing the mount surfaces 9a, 9b, 10a, 10b, 10c, 10d which are large enough to perform soldering without increasing either one or both of the width W of the package 8 and the projecting length L of the lead terminals from the side surfaces 8a, 8b of the package.

Further, since the island portions 4a, 4b and the bonding portions 5a, 5b, 5c, 5d are formed by plastic deformation of the ends of the lead terminals 2a, 2b, 3a, 3b, 3c, 3d, the corner portion 12 where each of the mount surfaces 9a, 9b, 10a, 10b, 10c, 10d and the side surface 11 rising from the mount surface toward the island portion 4a, 4b or the bonding portion 5a, 5b, 5c, 5d are connected to each other can be easily made angular, not round. Therefore, in transfer molding the package 8, it is possible to prevent or suppress the formation of a burr around the mount surfaces 9a, 9b, 10a, 10b, 10c, 10d, i.e., at the boundary between each of the mount surfaces and the lower surface 8c of the package 8.

FIGS. 5-9 show a first embodiment of method for manufacturing the electronic component 1 having the above-described structure.

Figure 5:
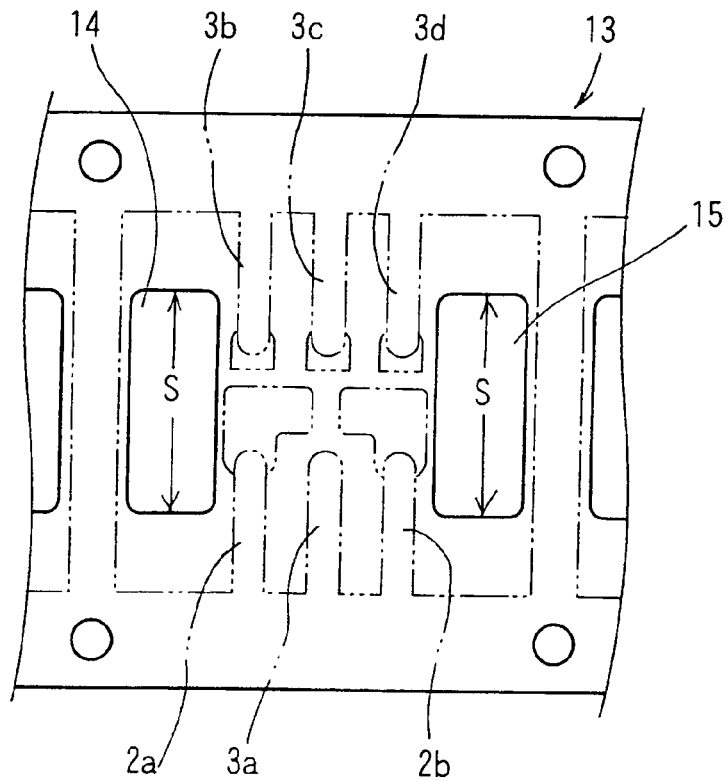
FIG. 5 shows a first step of a manufacturing method according to a first embodiment.

First, in the manufacturing method according to the first embodiment, a lead frame 13 having a relatively large thickness T0 is prepared by utilizing a metal material having excellent malleability such as the so-called 42 alloy containing iron and 42% of nickel. As shown in FIG. 5, in each of the regions of the lead frame 13 which are to become electronic components, two rectangular holes 14 and 15 are formed while keeping there between a space for forming lead terminals 2a, 2b, 3a, 3b, 3c, 3d.

Figure 6:
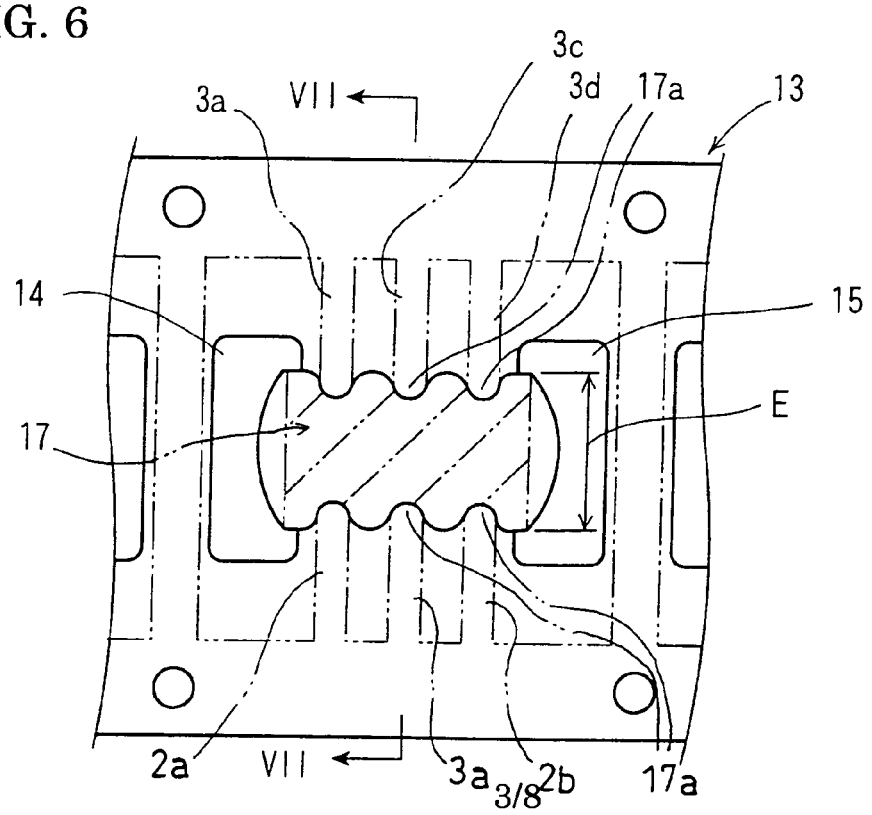
FIG. 6 shows a second step of the manufacturing method according to the first embodiment.
Figure 7:
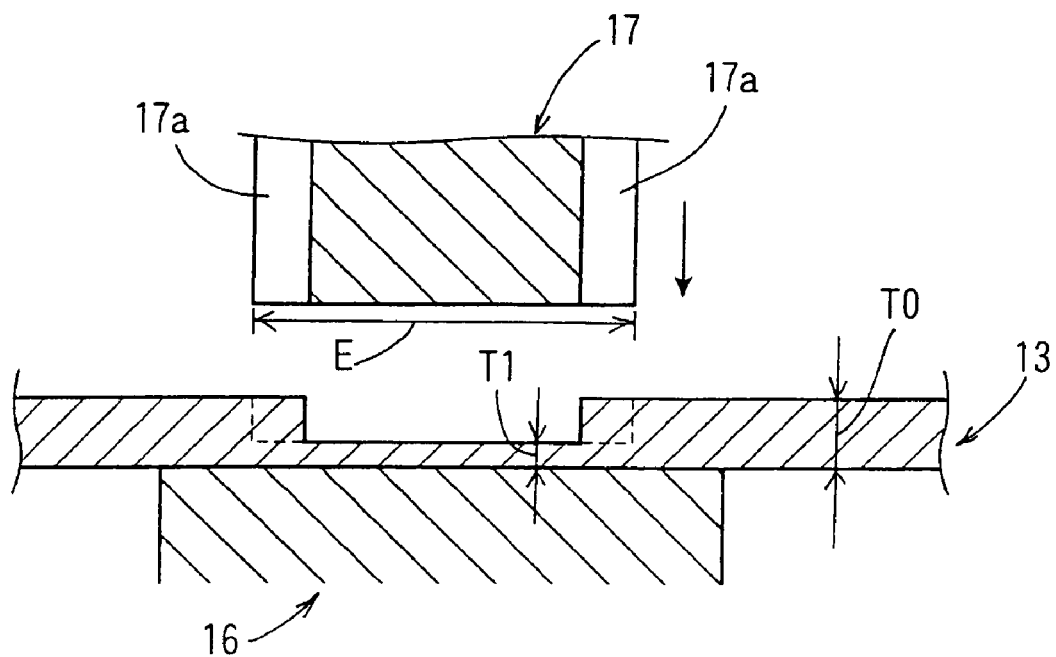
FIG. 7 is an enlarged sectional view taken along lines VII-VII in FIG. 6.
Figure 8:
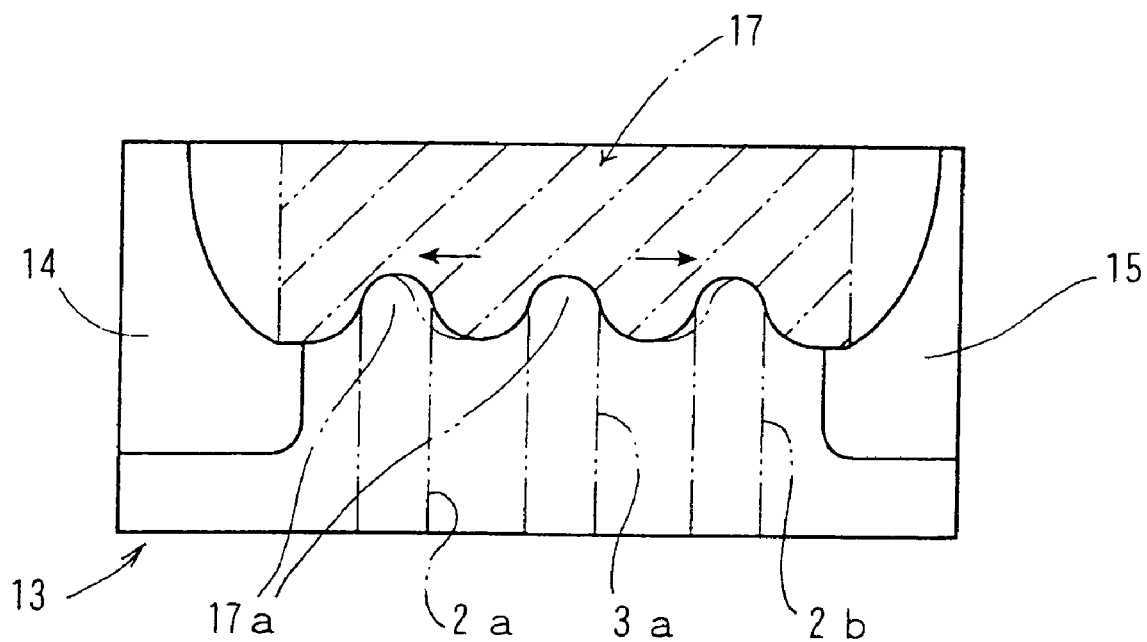
FIG. 8 is an enlarged view of a principal portion of FIG. 6.

Subsequently, as shown in FIGS. 6-8, the lead frame 13 is placed on a receiving die 16, with the upper surface 13a oriented downward and the lower surface 13b oriented upward. In this state, the portion of the lower surface 13b of the lead frame 13 between the holes 14 and 15 is deformed by plastic deformation. Specifically, this portion is dented by punching by moving a punch 17 downward toward the receiving die 16 so that the thickness of this portion is reduced from the original thickness of T0 to a smaller thickness T1.

The punch 17 used for the plastic deformation is formed, at opposite side surfaces thereof, with grooves 17a at positions corresponding to the lead terminals 2a, 2b, 3a, 3b, 3c, 3d. Due to the existence of the grooves 17a, the inner edge of each of the mount surfaces 9a, 9b, 10a, 10b, 10c, 10d of the lead terminals becomes semicircular.

Figure 9:
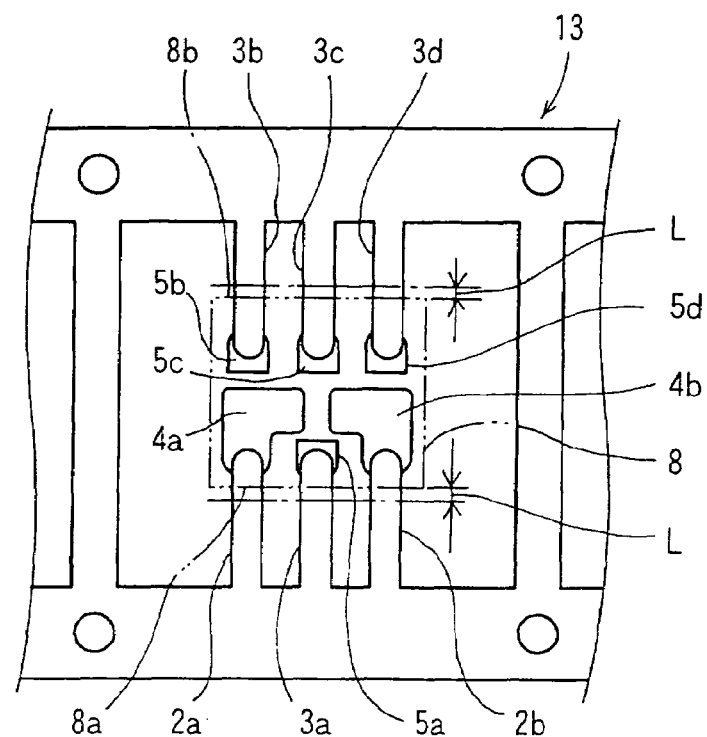
FIG. 9 shows a third step of the manufacturing method according to the first embodiment.

Subsequently, the lead frame 13 is subjected to punching using a non-illustrated receiving die and punch. As a result, as shown in FIG. 9, six lead terminals 2a, 2b, 3a, 3b, 3c, 3d, i.e., two first lead terminals 2a, 2b having ends integrally formed with island portions 4a, 4b and four second lead terminals 3a, 3b, 3c, 3d having ends integrally formed with bonding portions 5a, 5b, 5c, 5d are obtained.

Subsequently, with the lead frame 13 so set that the upper surface 13a is oriented upward, semiconductor elements 6a and 6b are bonded on the island portions 4a and 4b at the ends of the first lead terminals 2a and 2b, respectively. Then, the semiconductor elements 6a, 6b are connected to the bonding portions 5a, 5b, 5c, 5d at the ends of the second lead terminals 3a, 3b, 3c, 3d by wire bonding using metal wires 7a, 7b, 7c, 7d.

Subsequently, a package 8 is formed by the transfer molding of synthetic resin so that the ends of the lead terminals 2a, 2b, 3a, 3b, 3c, 3d are hermetically sealed in the package while the mount surfaces 9a, 9b, 10a, 10b, 10c, 10d at the lower surface of the lead terminals are exposed at the lower surface of the package 8, whereby the electronic component 1 is provided. Then, the lead terminals 2a, 2b, 3a, 3b, 3c, 3d are cut at positions spaced from the opposite side surfaces 8a, 8b of the resin package 8 by a predetermined distance L, whereby the electronic component is separated from the lead frame 13.

It is to be noted that metal plating with respect to the mount surfaces 9a, 9b, 10a, 10b, 10c, 10d can be performed either before or after the electronic component is separated from the lead frame 13 as long as it is after the package 8 is formed by transfer molding. It is also to be noted that the lead terminals 2a, 2b, 3a, 3b, 3c, 3d may be cut along the side surfaces 8a, 8b of the package 8.

As noted before, in deforming the lower surface 13b of the lead frame 13 by plastic deformation by punching with a punch 17 to partially dent the lower surface, two holes 14 and 15 are formed in the lead frame 13 in advance, and the portion between the holes 14 and 15 is subjected to the plastic deformation. Therefore, in the plastic deformation, excess thickness can be caused to escape toward the holes 14 and 15 located on opposite sides. Therefore, the load necessary for performing the plastic deformation can be reduced, and the lead frame 13 is prevented from warping due to the plastic deformation.

As noted before, the punch 17 formed with grooves 17a at the side surfaces is used in order to make the inner edge of each of the mount surfaces 9a, 9b, 10a, 10b, 10c, 10d of the lead terminals 2a, 2b, 3a, 3b, 3c, 3d semicircular. When the inner dimension S of the holes 14 and 15 in the longitudinal direction of the lead terminals is larger than the width E of the plastic deformation, the excess thickness can be smoothly pushed out into the holes 14 and 15 in the plastic deformation. In this case, however, as indicated by double-dashed lines in FIG. 8, the inner edges of the mount surfaces of the four lead terminals 2a, 2b, 3b, 3d located on the outer side do not become semicircular but become an irregular shape due to the pushing of the excess thickness toward the opposite holes 14 and 15.

Figure 10:
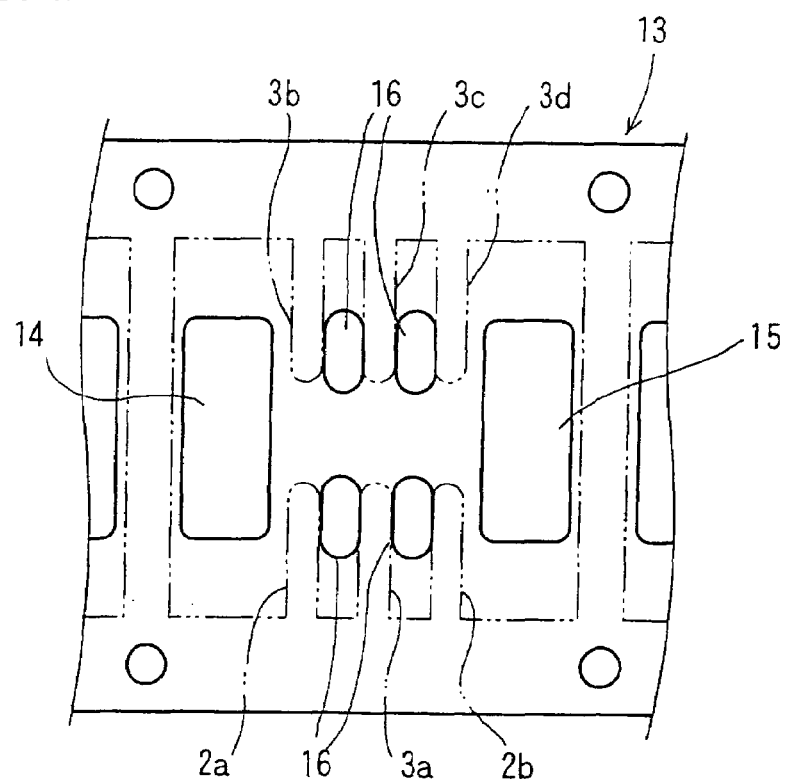
FIG. 10 shows a first step of a manufacturing method according to a second embodiment.
Figure 11:
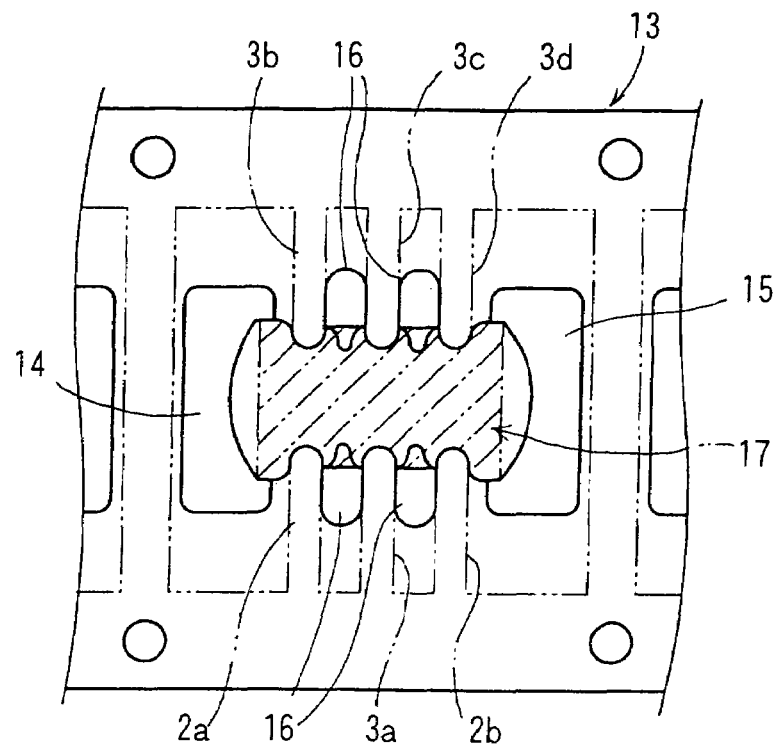
FIG. 11 shows a second step of the manufacturing method according to the second embodiment.

FIGS. 10 and 11 show a second embodiment of the present invention.

In the second embodiment, as shown in FIG. 10, in addition to the holes 14 and 15 on opposite sides of the portion to be subjected to plastic deformation, elongated auxiliary holes 16 are formed between the portions to become the lead terminals 2a, 2b, 3a, 3b, 3c, 3d.

Therefore, in the plastic deformation, the excess thickness is pushed out also into the auxiliary holes 16 in addition to the two holes 14 and 15, as shown in FIG. 11. As compared with the structure without the auxiliary holes 16, the influence of the pushing of the excess thickness on the mount surfaces of the outer four lead terminals 2a, 2b, 3c, 3d can be reduced. Therefore, the inner edge of the mount surfaces of the outer four lead terminals 2a, 2b, 3b, 3d can be properly made semicircular.

Figure 12:
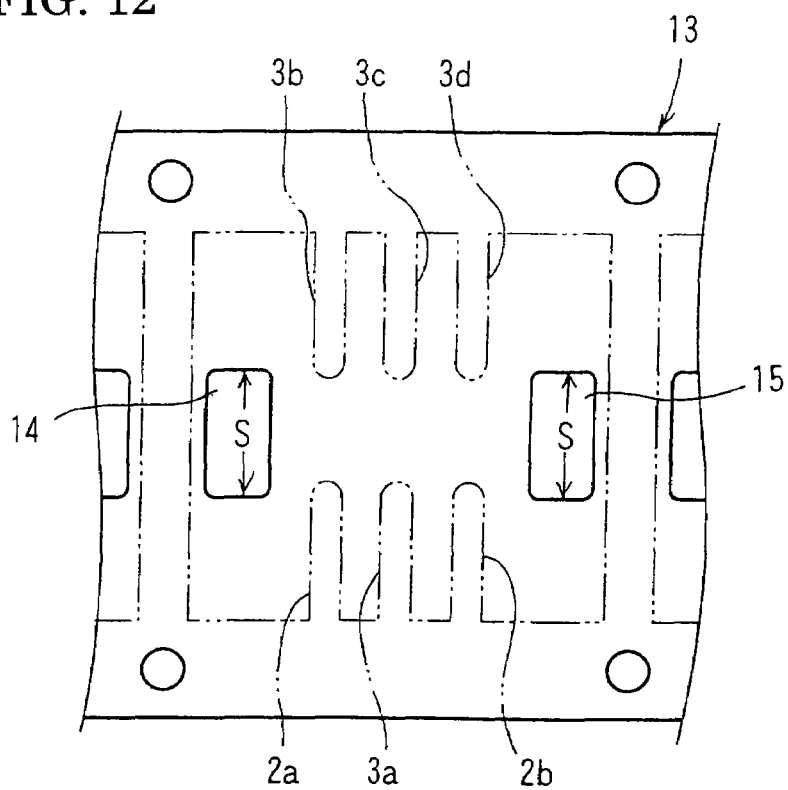
FIG. 12 shows a first step of a manufacturing method according to a third embodiment.
Figure 13:
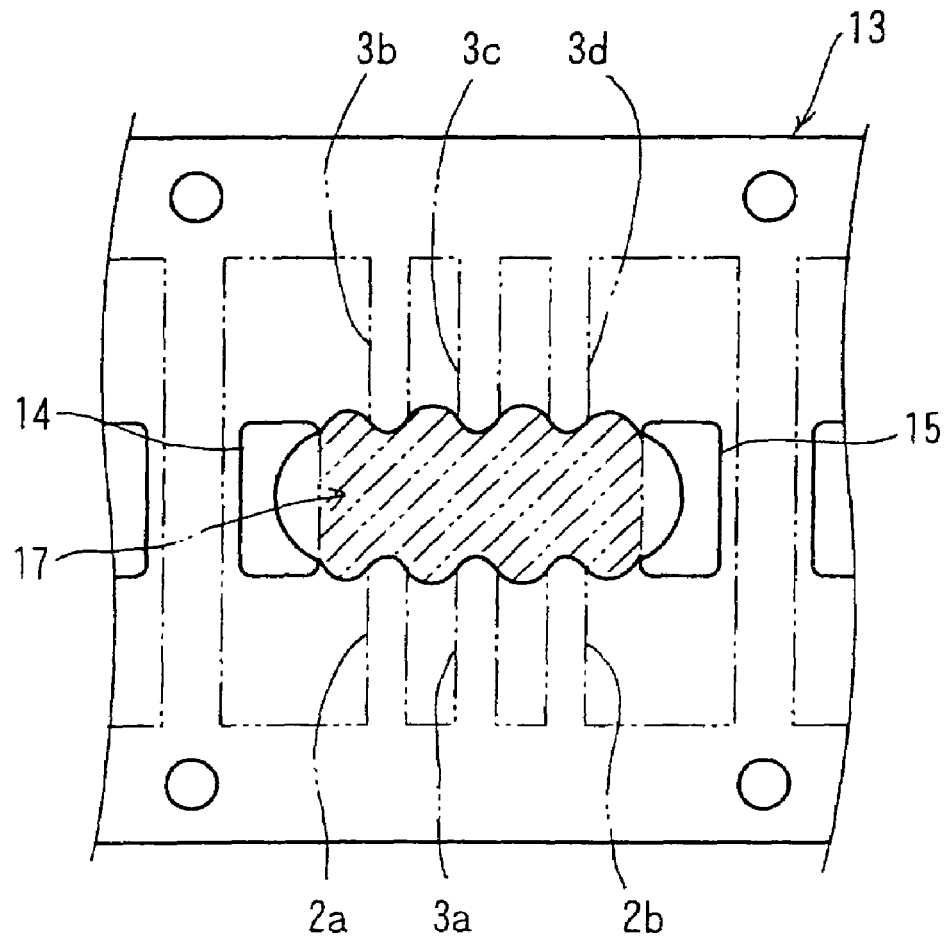
FIG. 13 shows a second step of the manufacturing method according to the third embodiment.
Figure 14:
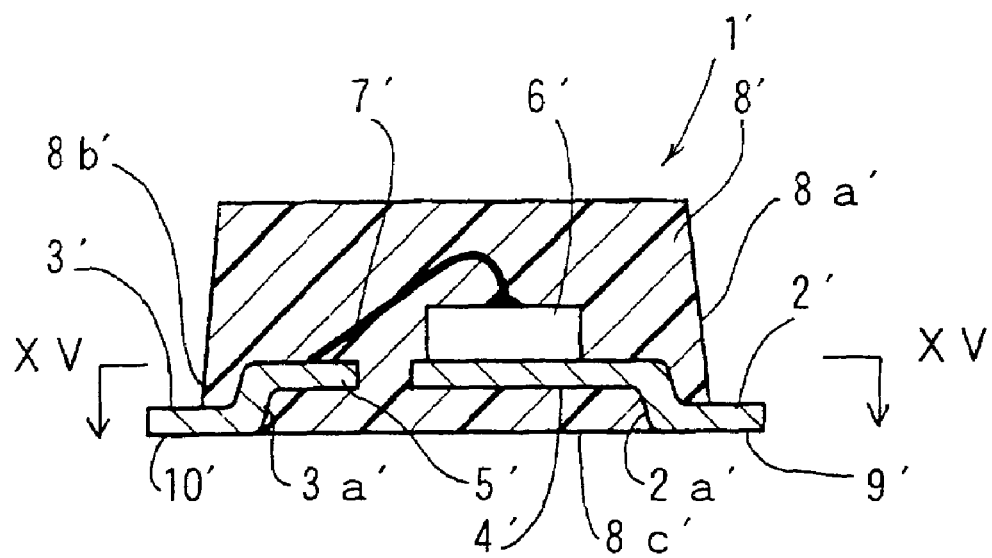
FIG. 14 is a vertical sectional view showing a conventional electronic component.
Figure 15:
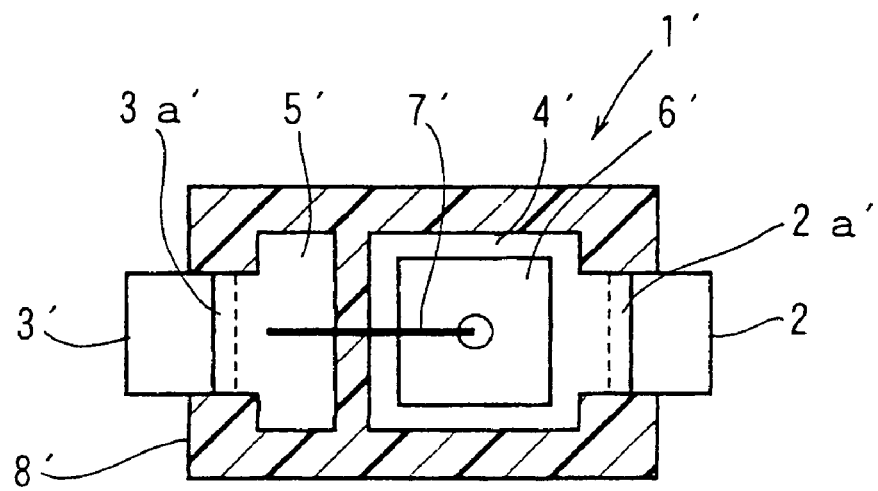
FIG. 15 is a sectional view taken along lines XV-XV in FIG. 14.
Figure 16:
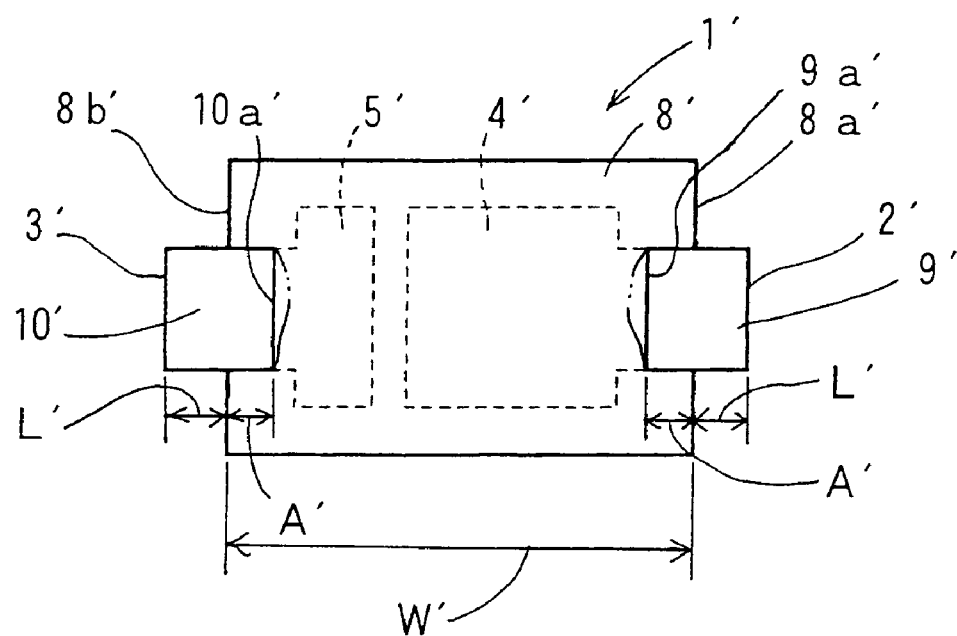
FIG. 16 is a bottom view of FIG. 14.

FIGS. 12 and 13 show a third embodiment of the present invention.

In the third embodiment, in forming the holes 14 and 15 on opposite sides of the portion of the lead frame 13 which is to be deformed by plastic deformation, the inner dimension S of the holes 14 and 15 in the longitudinal direction of the lead terminals is so set as not to exceed the width E of the plastic deformation.

With this arrangement, the plastic deformation is performed while pushing out excess thickness into the holes 14 and 15 whose inner dimension S is relatively small. Therefore, the influence of the pushing of the excess thickness on the mount surfaces of the outer four lead terminals 2a, 2b, 3b, 3d is small as compared with the structure in which the inner dimension S of the holes 14 and 15 is larger than the width E of the plastic deformation. Therefore, the inner edge of the mount surfaces of the outer four lead terminals 2a, 2b, 3b, 3d can be properly made semicircular.

In the foregoing embodiments, the electronic component 1 includes two sets of first and second lead terminals. However, the present invention is not limited thereto, and the electronic component may include a set of first and second lead terminals or three ore more sets of first and second lead terminals.

The invention claimed is:

1. A surface mount electronic component comprising: a set of a first lead terminal and a second lead terminal; a semiconductor element die-bonded to an upper surface of an island portion integrally formed at an end of the first lead terminal; a metal wire electrically connecting the semiconductor element and an upper surface of a bonding portion integrally formed at an end of the second lead terminal to each other; and a package made of synthetic resin and hermetically sealing the island portion and the bonding portion;
   wherein the island portion of the first lead terminal and the bonding portion of the second lead terminal are formed by plastic deformation of a portion of each of the lead terminals to be positioned within the package, the plastic deformation being performed from a lower surface side to reduce thickness and increase width while keeping upper surfaces of the island portion and the bonding portion flush or generally flush with upper surfaces of the lead terminals, and wherein a portion of a lower surface of each of the first lead terminal and the second lead terminal which is not subjected to the plastic deformation is exposed at a lower surface of the package to serve as a mount surface for soldering.

2. A method for manufacturing surface mount electronic component, the method comprising the steps of:
   subjecting part of a lead from to plastic deformation so as to dent the part from a lower surface side thereof;
   punching the lead frame to provide a set of a first lead terminal and a second lead terminal which extend across a line connecting two holes so that the first lead terminal includes a thin and wide island portion formed by the plastic deformation and the second lead terminal includes a thin and wide bonding portion formed by the plastic deformation;
   die-bonding a semiconductor element on an upper surface of the island portion of the first lead terminal, and connecting the semiconductor element and an upper surface of the bonding portion of the second lead terminal to each other by wire bonding using a metal wire;
   hermetically sealing the island portion of the first lead terminal and the bonding portion of the second lead terminal in a package of synthetic resin so that a portion of a lower surface of each of the first lead terminal and the second lead terminal which is not subjected to the plastic deformation is exposed at a lower surface of the package to serve as a mount surface for soldering; and
   cutting a portion of each of the lead terminals which projects from the package.

3. A method for manufacturing surface mount electronic component, the method comprising the steps of:
   forming two holes in a lead frame while keeping an appropriate space between the holes;
   performing plastic deformation of a portion of the lead frame between the holes to dent the portion from a lower surface side; punching the lead frame to provide sets of first lead terminals and second lead terminals each of which extends across a line connecting the two holes so that each of the first lead terminals includes a thin and wide island portion formed by the plastic deformation and each of the second lead terminals includes a thin and wide bonding portion formed by the plastic deformation;
   die-bonding a semiconductor element on an upper surface of the island portion of each of the first lead terminals and connecting the semiconductor element and an upper surface of the bonding portion of the second lead terminal in a same set to each other by wire bonding using a metal wire;
   hermetically sealing the island portion of each of the first lead terminals and the bonding portion of each of the second lead terminals in a package of synthetic resin so that a portion of a lower surface of each of the lead terminals which is not subjected to the plastic deformation is exposed at a lower surface of the package to serve as a mount surface for soldering; and
   cutting a portion of each of the lead terminals which projects from the package.

4. The method for manufacturing surface mount electronic component according to claim 3, further comprising the step of forming an auxiliary hole between the lead terminals of the lead frame before the step of performing plastic deformation of the lead frame to dent the lead frame from the lower surface side.

5. The method for manufacturing surface mount electronic component according to claim 3, wherein inner dimension of the two holes of the lead frame along a longitudinal direction of the lead terminals is not larger than width of the plastic deformation to dent the lead frame.

* * * * *